United States Patent
Asaka

(10) Patent No.: US 9,412,726 B2
(45) Date of Patent: Aug. 9, 2016

(54) DISPLAY DEVICE

(71) Applicant: Japan Display Inc., Tokyo (JP)

(72) Inventor: Tsuneyuki Asaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/679,306

(22) Filed: Apr. 6, 2015

(65) Prior Publication Data
US 2015/0287707 A1  Oct. 8, 2015

(30) Foreign Application Priority Data
Apr. 7, 2014 (JP) .................. 2014-078981

(51) Int. Cl.
*H01L 27/32* (2006.01)
*H01L 25/18* (2006.01)
*H01L 27/12* (2006.01)
*G02F 1/1345* (2006.01)
*H05K 1/03* (2006.01)
*H05K 1/11* (2006.01)
*H05K 3/32* (2006.01)

(52) U.S. Cl.
CPC .............. *H01L 25/18* (2013.01); *G02F 1/1345* (2013.01); *H01L 27/124* (2013.01); *H01L 27/1248* (2013.01); *H01L 27/3248* (2013.01); *H01L 27/3253* (2013.01); *H05K 1/0306* (2013.01); *H05K 1/111* (2013.01); *H05K 3/323* (2013.01); *H05K 2201/0104* (2013.01); *H05K 2201/0326* (2013.01); *H05K 2201/10128* (2013.01)

(58) Field of Classification Search
CPC . H01L 27/3253; H01L 27/3248; H01L 24/02; H01L 24/04; H01L 24/06; H01L 24/07; H01L 24/08; H01L 24/09; H01L 24/26; H01L 24/28
See application file for complete search history.

(56) References Cited

U.S. PATENT DOCUMENTS

| 2005/0073247 A1* | 4/2005 | Yamazaki | H01L 27/3211 313/503 |
| 2005/0194678 A1* | 9/2005 | Chuang | H01L 23/49838 257/734 |
| 2008/0315208 A1* | 12/2008 | Yamazaki | G02F 1/13458 257/72 |
| 2009/0209160 A1* | 8/2009 | Jung | G02F 1/13452 445/24 |
| 2010/0123160 A1* | 5/2010 | Hatano | H01L 27/3251 257/99 |
| 2011/0101314 A1* | 5/2011 | Kim | H01L 51/5203 257/40 |
| 2011/0240991 A1* | 10/2011 | Yamazaki | H01L 29/7831 257/43 |
| 2012/0292622 A1* | 11/2012 | Liu | H01L 27/3248 257/59 |
| 2014/0054582 A1* | 2/2014 | Yamazaki | H01L 33/0041 257/43 |

FOREIGN PATENT DOCUMENTS

JP    2008-172138 A    7/2008

* cited by examiner

*Primary Examiner* — David Zarneke
(74) *Attorney, Agent, or Firm* — TYPHA IP LLC

(57) ABSTRACT

A display device includes a substrate on which a plurality of pixels are arranged and a circuit for displaying images with respect to each pixel is formed, a substrate terminal as a terminal formed on the substrate, and an electronic component terminal as a terminal of an electronic component electrically connected to the terminal via an anisotropic conductive film. A conductive region that conducts to the anisotropic conductive film in the substrate terminal has a light transmissive part in which a material having light transmissivity penetrates the substrate surface in a perpendicular direction.

7 Claims, 13 Drawing Sheets

FIG.4

| KIND OF FILM | MATERIAL | THICKNESS |
| --- | --- | --- |
| LIGHT TRANSMISSIVE FILM 308 | SiN/SiO | 690nm |
| FIRST INORGANIC INSULATIVE FILM 303 | SiN/SiO | 690nm |
| INSULATIVE FILM 302 | TEOS | 80nm |
| FOUNDATION FILM 307 | Poly Si | 49nm |
| SECOND INORGANIC INSULATIVE FILM 305 | SiN | 180nm |
| SECOND TRANSPARENT CONDUCTIVE FILM 304 | ITO | 50nm |
| FIRST TRANSPARENT CONDUCTIVE FILM 306 | ITO | 50nm |

FIG.6
(Related Art)

| KIND OF FILM | MATERIAL | THICKNESS |
|---|---|---|
| METAL FILM 309 | Ti/Al/Ti(TiN) | 423nm |
| FIRST INORGANIC INSULATIVE FILM 303 | SiN/SiO | 690nm |
| INSULATIVE FILM 302 | TEOS | 80nm |
| FOUNDATION FILM 307 | Poly Si | 49nm |
| SECOND INORGANIC INSULATIVE FILM 305 | SiN | 180nm |
| SECOND TRANSPARENT CONDUCTIVE FILM 304 | ITO | 50nm |
| FIRST TRANSPARENT CONDUCTIVE FILM 306 | ITO | 50nm |

FIG.9

| KIND OF FILM | MATERIAL | THICKNESS |
|---|---|---|
| METAL FILM 309 | Ti/Al/Ti(TiN) | 423nm |
| LIGHT TRANSMISSIVE FILM 308 | SiN/SiO | 423nm |
| FIRST INORGANIC INSULATIVE FILM 303 | SiN/SiO | 690nm |
| INSULATIVE FILM 302 | TEOS | 80nm |
| FOUNDATION FILM 307 | Poly Si | 49nm |
| SECOND INORGANIC INSULATIVE FILM 305 | SiN | 180nm |
| SECOND TRANSPARENT CONDUCTIVE FILM 304 | ITO | 50nm |
| FIRST TRANSPARENT CONDUCTIVE FILM 306 | ITO | 50nm |

DISPLAY DEVICE

CROSS-REFERENCE TO RELATED APPLICATION

The present application claims priority from Japanese application JP2014-078981 filed on Apr. 7, 2014, the content of which is hereby incorporated by reference into this application.

BACKGROUND OF THE INVENTION

1. Field of the Invention
This invention relates to a display device.
2. Description of the Related Art
As display devices such as information communication terminals including computers and television receivers, liquid crystal display devices are widely used. Further, organic EL (Electro-Luminescent) display devices are also known as thin display devices. The display panel of the thin display device performs display by operating TFTs (Thin Film Transistors) formed on respective pixels of a display area on a substrate. Here, the TFT is driven by a drive IC (Integrated Circuit) as a semiconductor integrated circuit element mounted outside of the display area, and generally, the terminal of the drive IC (bump) and wiring on the substrate are connected using an anisotropic conductive film (ACF) or the like.

JP 2008-172138 A discloses junction between a pattern electrode formed on a glass panel and a pattern electrode formed on an FPC (Flexible Printed Circuits) using a UV (Ultra Violet) curing material.

In related art, the wiring of the display device and the terminal (bump) of the drive IC or the terminal of the FPC are pressure-joined using a thermosetting anisotropic conductive film. However, with the thermosetting anisotropic conductive film, the display panel can be warped due to heat at pressure-joining and luminance unevenness is caused in display of the display device. Further, when a touch panel is attached onto the display panel, stress distributions are biased in both the touch panel and the display panel due to warp of the display panel, and further luminance unevenness etc. are caused. On the other hand, in a sheet display having a substrate of the display device formed using a flexible or bendable material, the substrate largely deforms due to heat and it is difficult to directly use the thermosetting anisotropic conductive film.

Here, an ultraviolet curing anisotropic conductive film requires the lower heating temperature than the thermosetting anisotropic conductive film, and, as a solution to the above described problem, use of the ultraviolet curing anisotropic conductive film cured by application of ultraviolet light is considered. However, the terminal on the substrate is formed using a light-blocking metal, and there may be locations in the anisotropic conductive film without sufficient application of ultraviolet light and reliability of connection may be insufficient.

SUMMARY OF THE INVENTION

The invention has been achieved in view of the above described situations, and an object of the invention is to provide a display device with further improved reliability in connection of an ultraviolet curing anisotropic conductive film.

A display device of the invention includes a substrate on which a plurality of pixels are arranged and a circuit for displaying images with respect to each pixel is formed, a substrate terminal as a terminal formed on the substrate, and an electronic component terminal as a terminal of an electronic component electrically connected to the terminal via an anisotropic conductive film, wherein a conductive region that conducts to the anisotropic conductive film in the substrate terminal has a light transmissive part in which a material having light transmissivity penetrates the substrate surface in a perpendicular direction at least in a part.

Further, in the display device of the invention, the light transmissive part may include a plurality of layers, and at least one of the plurality of layers may be a layer of an inorganic insulative material.

Furthermore, in the display device of the invention, the conductive region may have metal parts of a metal material having a light-blocking property, and the light transmissive part may be sandwiched between the metal parts and extend in the perpendicular direction. In this case, the light transmissive part may be formed in a plurality of locations of the conductive region in a plan view and each may have a circular shape. Or, a plurality of the light transmissive parts may be formed in strip shapes and arranged in parallel in a plan view. In addition, a width of the light transmissive part sandwiched between the metal parts may be a width equal to or less than one third of a metal particle of the anisotropic conductive film.

BRIEF DESCRIPTION OF THE DRAWINGS

FIG. 4 is a table showing examples of thicknesses of respective films in a structure of FIG. 3.

FIG. 6 is a table showing examples of thicknesses of respective films in a structure of FIG. 5.

FIG. 9 is a table showing examples of thicknesses of respective films in a structure of FIG. 8.

DETAILED DESCRIPTION OF THE INVENTION

Figure 1:
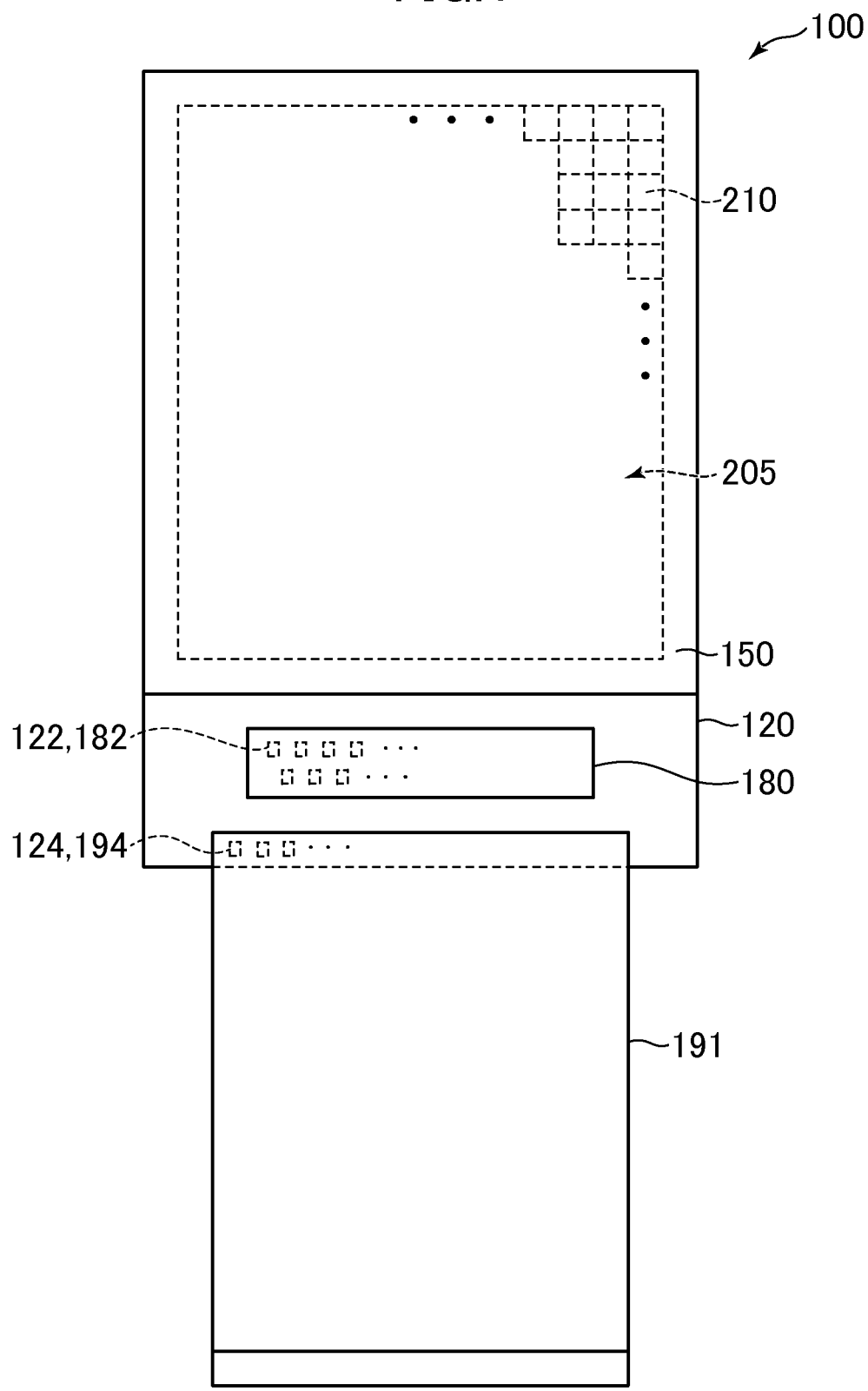
FIG. 1 schematically shows a display device according to an embodiment of the invention.

As below, respective embodiments of the invention will be explained with reference to the drawings. Note that the disclosure is just an example and the scope of the invention naturally includes appropriate changes that could be readily achieved while keeping the spirit of the invention. Further, in the drawings, for clearer explanation, widths, thicknesses, shapes, etc. of respective parts may be schematically shown compared to the actual forms, however, they are just examples and do not limit the interpretation of the invention. Furthermore, in the specification and the drawings, the same signs are assigned to the similar elements previously described with respect to the previously mentioned drawings, and the detailed explanation may be appropriately omitted.

FIG. 1 schematically shows a display device 100 according to an embodiment of the invention. As shown in the drawing, the display device 100 has two substrates of a TFT (Thin Film Transistor) substrate 120 and an opposite substrate 150 and the substrates are superimposed on each other. A display area 205 of pixels 210 arranged in a matrix is formed on the TFT substrate 120 and the opposite substrate 150 of the display device 100.

The TFT substrate 120 is a substrate formed using an insulative material of transparent glass or resin. On the TFT substrate 120, a drive IC (Integrated Circuit) 180 as a semiconductor integrated circuit element that applies potentials for conduction between sources and drains to scanning signal lines of pixel transistors provided for the respective pixels 210 and applies voltages corresponding to gray level values of the pixels 210 to image signal lines is mounted. Further, an FPC (Flexible Printed Circuits) 191 for externally inputting image signals or the like is attached thereto. Here, in FIG. 1, the display device 100 in which the two substrates are superimposed is shown, however, a display device that performs display using a single substrate without the opposite substrate 150 may be employed.

Furthermore, on the TFT substrate 120, substrate terminals 122 as terminals that transfer electric signals are formed, and the substrate terminals 122 are connected to electronic component terminals (hereinafter, referred to as "bumps") 182 as terminals of the drive IC 180 via an anisotropic conductive film 311, which will be described later. Further, similarly, on the TFT substrate 120, substrate terminals 124 connected to electronic component terminals 194 of the FPC 191 via an anisotropic conductive film are also formed.

Figure 2:
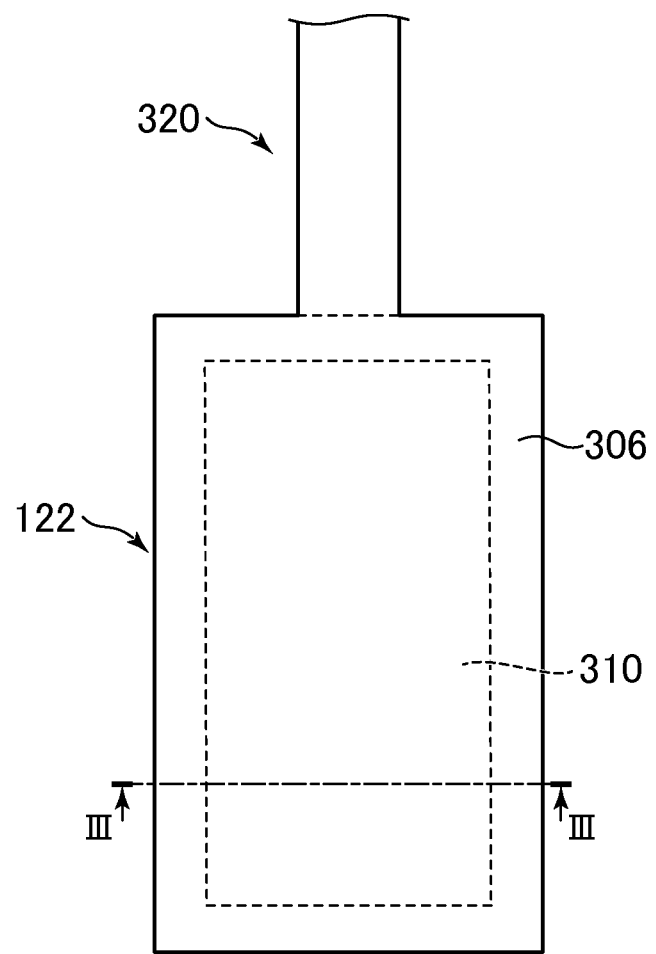
FIG. 2 is a plan view schematically showing a terminal connected via an anisotropic conductive film.

FIG. 2 schematically shows a plan view of the substrate terminal 122 connected to the bump 182 via the anisotropic conductive film 311 on the TFT substrate 120. As shown in the drawing, the substrate terminal 122 is formed on an end of a wire 320 and has a surface covered by a first transparent conductive film 306 like the wire. The substrate terminal 122 has a light transmissive part 310 of materials having light transmissivity including the first transparent conductive film 306 formed to penetrate the surface of the TFT substrate 120 in the perpendicular direction.

Figure 3:
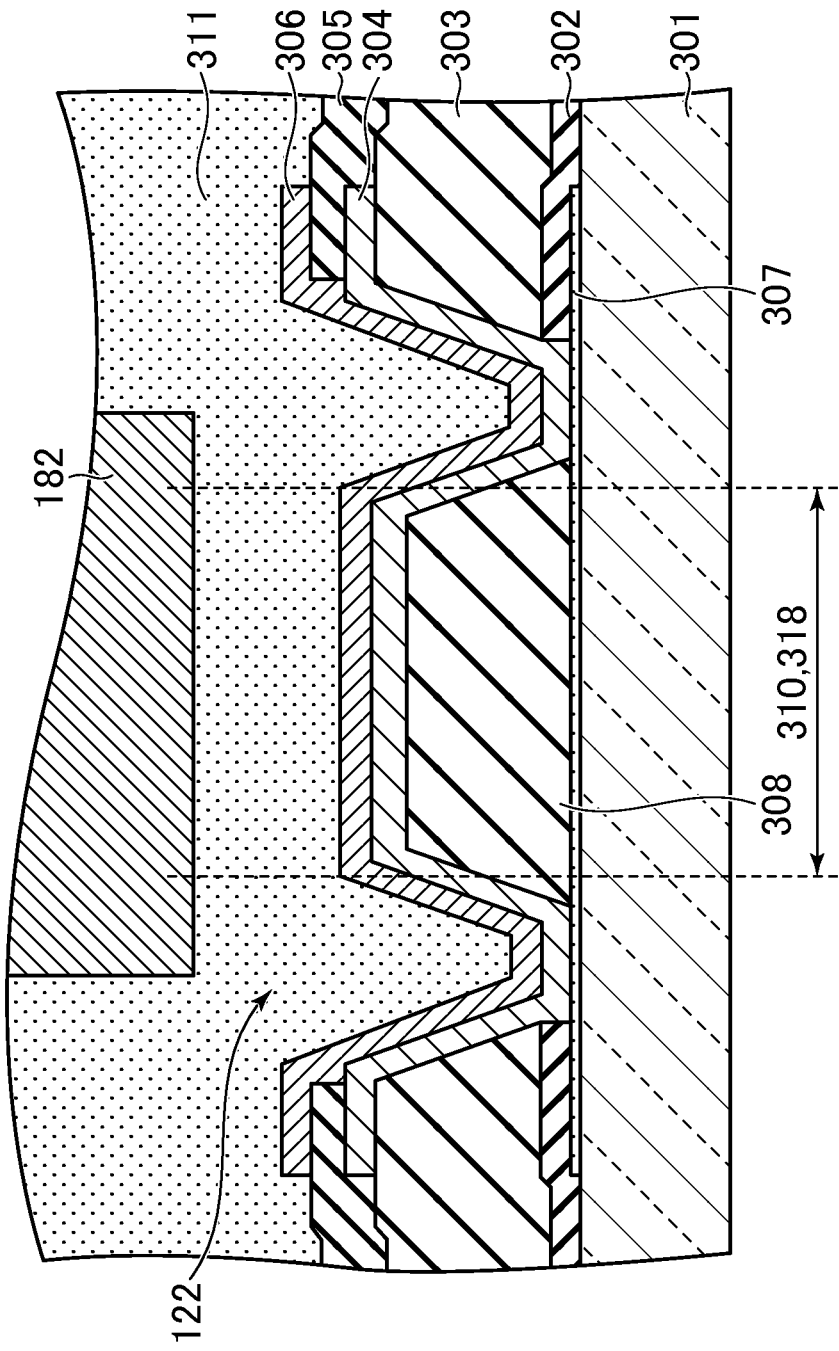
FIG. 3 shows a section along III-III line in FIG. 2, and a sectional view with a state of connection between a bump and the anisotropic conductive film.

FIG. 3 shows a section along III-III line in FIG. 2, and a sectional view with a state of connection between the bump 182 and the anisotropic conductive film 311. As shown in the drawing, the substrate terminal 122 is pressure-joined to the bump 182 via the anisotropic conductive film 311. The substrate terminal 122 includes a foundation film 307 having transparency of polysilicon or the like formed on a substrate 301 of a transparent insulative material such as glass, insulative films 302 of TEOS (tetraethoxysilane) or the like formed to cover the ends of the foundation film, first inorganic insulative films 303 of inorganic insulative films such as SiN, SiO, or the like, a light transmissive film 308 of SiN, SiO, or the like for transmitting light, a second transparent conductive film 304 of a transparent conductive film of a material of indium tin oxide (ITO), indium zinc oxide (IZO), or the like formed on the first inorganic insulative films 303 and the light transmissive film 308, second inorganic insulative films 305 of SiN or the like formed to cover the ends of the second transparent conductive film 304, and a first transparent conductive film 306 of a material of indium tin oxide, indium zinc oxide, or the like formed on the second transparent conductive film 304 and the second inorganic insulative films 305.

Here, the substrate terminal 122 has a conductive region 318 as a portion in which the substrate terminal 122 is formed to be thicker of the part with the bump 182 superimposed thereon, i.e., a portion in contact with the metal particles contained in the anisotropic conductive film 311 at pressure-joining for conduction between the bump 182 and the substrate terminal 122. In the embodiment, the films penetrating the substrate surface of the TFT substrate 120 in the perpendicular direction in the conductive region 318 are the foundation film 307, the light transmissive film 308, the first transparent conductive film 306, and the second transparent conductive film 304, and the films respectively transmit light and form the light transmissive part 310.

FIG. 4 is a table showing examples of thicknesses of the respective films in the structure of FIG. 3. Here, the first inorganic insulative films 303 and the light transmissive film 308 may be formed using the same material and, in this case, the films may be formed at the same time in the same manufacturing process. Thereby, the manufacturing process may be simplified and the manufacturing cost may be reduced. However, for the light transmissive film 308, not limited to the same material as that of the first inorganic insulative films 303 or an insulative film, but a material having light transmissivity of indium tin oxide, indium zinc oxide, or the like may be used.

Note that, when the semiconductor of the thin film transistor used in the display area 205 is formed using polysilicon, the foundation film 307 may be formed at the same time as the semiconductor film. However, the foundation film 307 may be formed using other materials and a configuration without the foundation film 307 may be employed. Further, the semiconductor used for the thin film transistor of the display area 205 is not limited to polysilicon, but a semiconductor material of amorphous, oxide semiconductor or the like may be used. Furthermore, in the embodiment, the configuration in which the two transparent conductive films of the first transparent conductive film 306 and the second transparent conductive film 304 are superimposed is employed, however, a configuration having a single transparent conductive film or three or more superimposed transparent conductive films may be employed. The kinds and locations of the insulative films are not limited to those in the configuration of the above described embodiment, but may be appropriately determined. Further, the thicknesses of the respective layers are not limited to those shown in the table, but may be appropriately determined.

Figure 5:
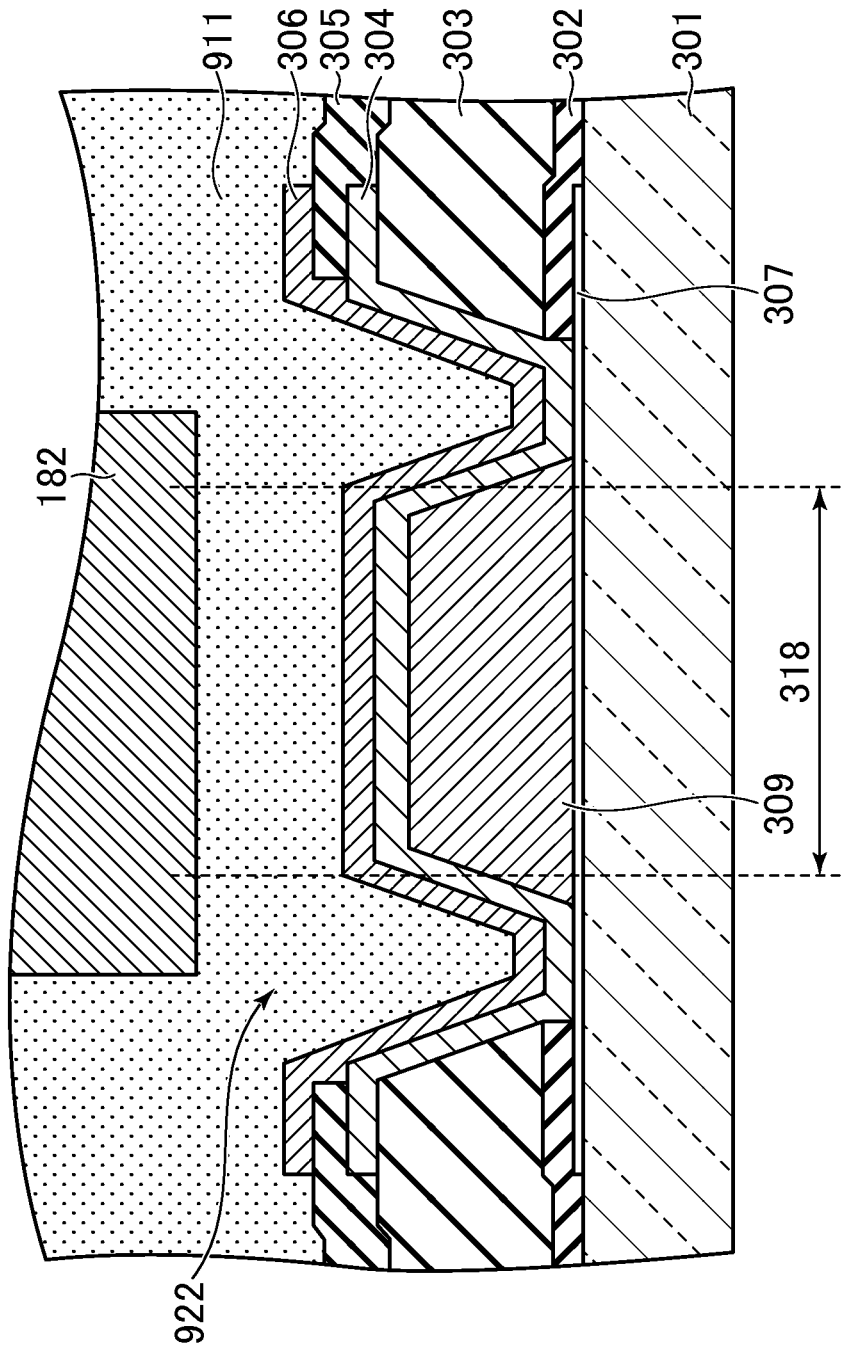
FIG. 5 is a sectional view of a terminal according to a comparative example of the structure in FIG. 3.

FIG. 5 shows a section of a substrate terminal 922 according to a comparative example of the structure in FIG. 3. The substrate terminal 922 is different in that the part of the light transmissive film 308 in FIG. 3 is formed by a metal having a light-blocking property, e.g., a metal film 309 having a light-blocking property in a laminated structure of (Ti/Al/Ti) or (Ti/Al/TiN) or the like. When a thermosetting anisotropic conductive film 911 is used, the film is cured without application of ultraviolet light, and reliability of the electrical connection may be obtained even by the structure. However, when an anisotropic conductive film cured by ultraviolet light is used in the structure, the ultraviolet light applied from below is blocked by the metal film 309 and the ultraviolet light is not applied to the anisotropic conductive film 911 between the bump 182 and the substrate terminal 922. Accordingly, uniform curing of the anisotropic conductive film 911 is harder and connection failure may be caused. FIG. 6 is a table showing examples of thicknesses of the respective films in the structure of FIG. 5 as the comparative example.

As shown in FIGS. 2 and 3, in the embodiment of the invention, the part formed by the metal film 309 in FIG. 5 is formed by the light transmissive film 308, and thereby, the light transmissive part 310 in which the materials having light transmissivity penetrate the surface of the TFT substrate 120 in the perpendicular direction may be formed. According to the configuration, the ultraviolet light applied from the substrate 301 side may be transmitted, and, even when an ultraviolet curing material is used as the anisotropic conductive film 311, the ultraviolet light may be applied to the anisotropic conductive film 311 superimposed on the substrate terminal 122 and sufficient pressure-joining may be performed. Therefore, according to the embodiment, even when the electronic components are connected using an ultraviolet curing anisotropic conductive film, the connection strength may be made sufficient and the reliability of the electrical connection may be further improved.

Note that, in the above described embodiment, the case of the connection to the bump 182 of the drive IC 180 is described, and the same applies to the case of connection to the electronic component terminal 194 of the FPC 191 and the same advantages may be obtained. Further, not limited to the semiconductor integrated circuit element, the embodiment may be applied to the case where the terminals of the FPC or other electronic components are pressure-joined using an ultraviolet curing anisotropic conductive film and the same advantages may be obtained. In the following respective modified examples, the bump 182 of the drive IC 180 will be explained as an example, and the same applies to the case of connection to the terminal of the FPC or other electronic apparatuses and the same advantages may be obtained.

Figure 7:
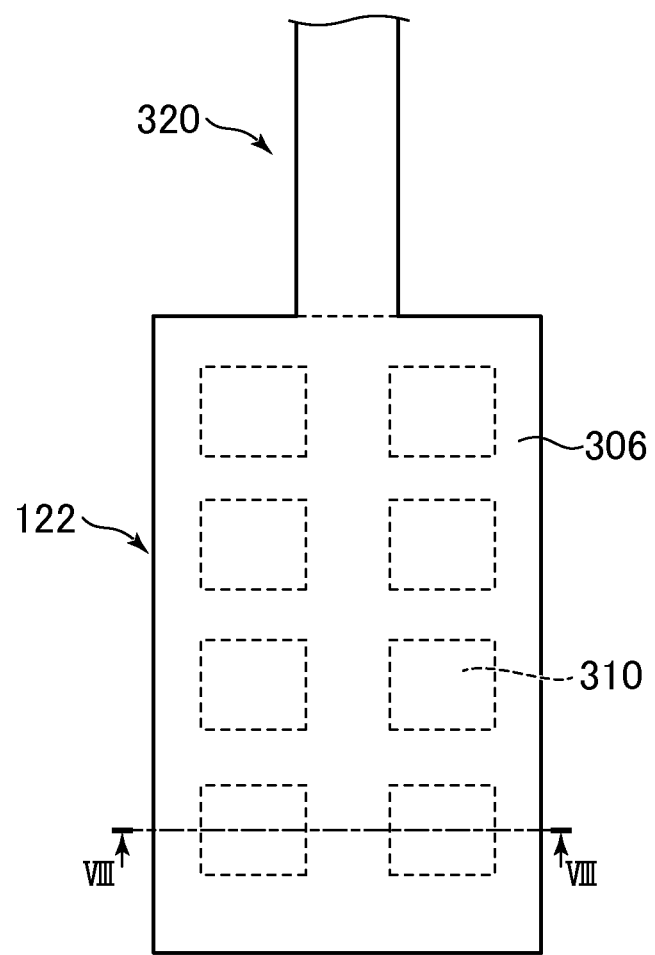
FIG. 7 is a plan view schematically showing a terminal formed on a TFT substrate in a first modified example.
Figure 8:
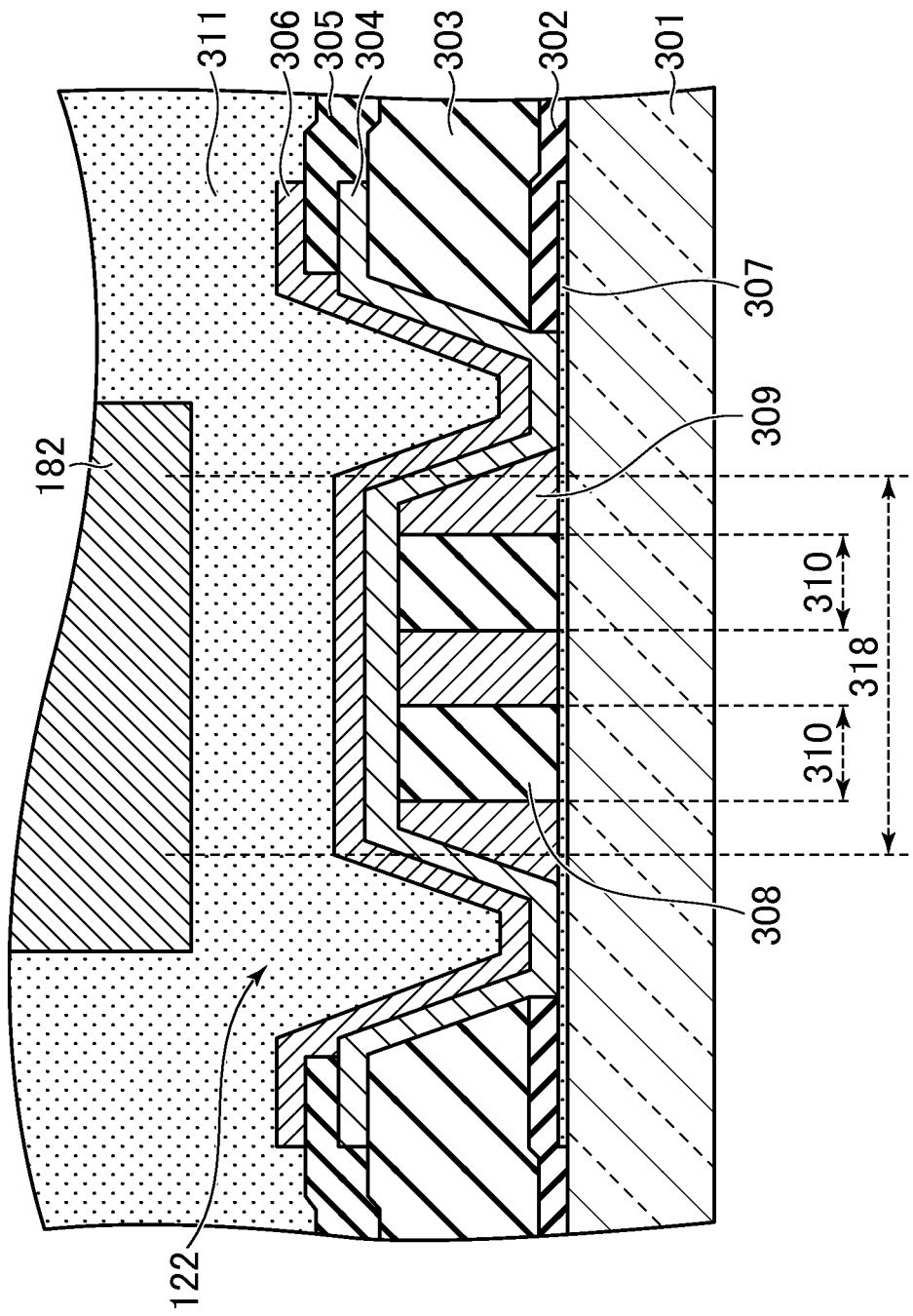
FIG. 8 schematically shows a section along VIII-VIII line in FIG. 7.

FIGS. 7 to 9 show a first modified example of the above described embodiment. FIG. 7 is a plan view schematically showing the substrate terminal 122 formed on the TFT substrate 120 in the first modified example. As shown in the drawing, in the first modified example, the light transmissive parts 310 are arranged in a matrix in the plan view. FIG. 8 schematically shows a section along VIII-VIII line in FIG. 7. In the first modified example, unlike the embodiment in FIG. 3, the metal films 309 having a light-blocking property are formed in addition to the light transmissive films 308 under the second transparent conductive film 304 in the conductive region 318, and the light transmissive films 308 are formed between the metal films 309. As described above, the light transmissive films 308 are formed between the metal films 309, and thereby, in the light transmissive parts 310, ultraviolet light applied from the substrate 301 side may be transmitted and the conductivity may be improved by the metal films 309 having higher conductivity. Therefore, even when the ultraviolet curing anisotropic conductive film 911 is used, like the above described embodiment, the connection strength may be made sufficient, the reliability of electrical connection may be further improved, and additionally, the connection resistance may be suppressed by the metal films 309.

FIG. 9 is a table showing examples of thicknesses of the respective films in the structure of FIG. 8. Also, in this table, the same alternative materials as those described in the explanation with respect to the table of FIG. 4 may be used and the same advantages as the above described advantages may be obtained. To form the light transmissive films 308 between the metal films 309 as shown in FIG. 8, the metal film 309 may be bored by the photolithography process or the like, and then, the light transmissive films 308 may be formed. In this case, as shown in FIG. 9, the thickness of the light transmissive films 308 may be formed to be equal to the thickness of the metal films 309. When the light transmissive films 308 and the first inorganic insulative films 303 are formed at the same time using the same material, the thickness of the light transmissive films 308 may be formed to be smaller. When the material of the light transmissive films 308 is the same as that of the first inorganic insulative films 303, the films may be formed at the same time, and the manufacturing process may be reduced and the manufacturing cost may be suppressed. Here, the metal films 309 have the laminated structure of (Ti/Al/Ti) or (Ti/Al/TiN), and may be formed using other metals including Ti, Al, Cu, Mo, Fe, etc. Further, the thicknesses of the respective layers are not limited to those shown in the table, but may be appropriately determined.

Figure 10:
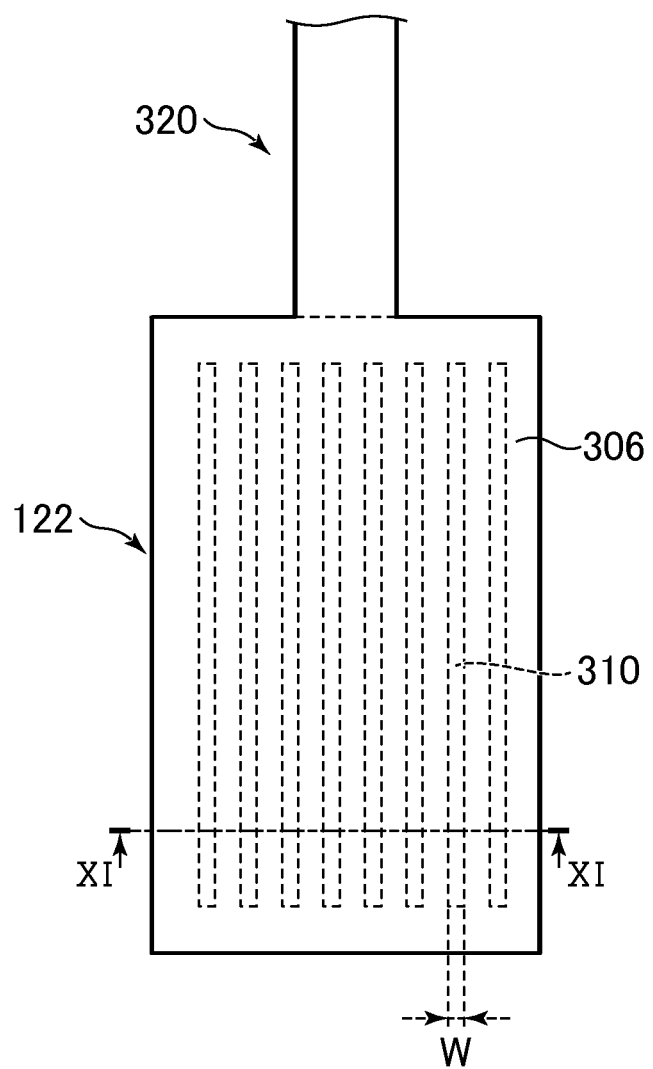
FIG. 10 is a plan view schematically showing a terminal in a second modified example.
Figure 11:
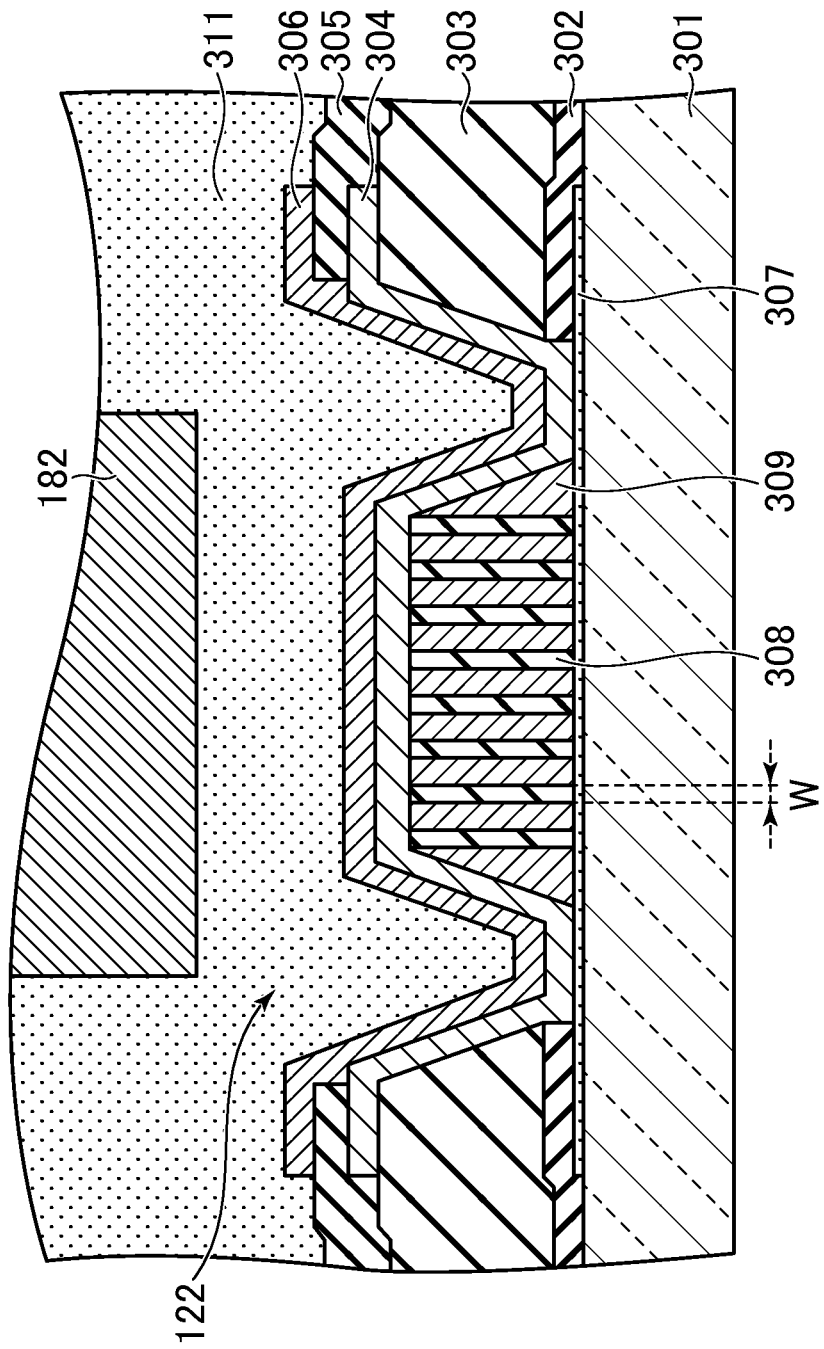
FIG. 11 schematically shows a section along XI-XI line in FIG. 10.

FIGS. 10 and 11 show a second modified example of the above described embodiment. FIG. 10 is a plan view schematically showing the substrate terminal 122 in the second modified example. As shown in the drawing, in the second modified example, the substrate terminal 122 has a rectangular shape having long sides and short sides in the plan view, and the plurality of strip-shaped light transmissive parts 310 extend in parallel along the long sides. FIG. 11 schematically shows a section along XI-XI line in FIG. 10. In the second modified example, like the first modified example, the metal films 309 are formed in addition to the light transmissive films 308 under the second transparent conductive film 304 in the conductive region 318, and the light transmissive films 308 are formed between the metal films 309. Therefore, the same advantages as those of the first modified example may be obtained. Further, the same alternative materials as those of the first modified example may be used. Here, the width W of the strip-shaped light transmissive parts 310 may be made to be a width equal to or less than one third of a particle diameter of metal particles of the anisotropic conductive film 311. The width equal to or less than one third may prevent the metal particles from entering the light transmissive films 308 at pressure-joining of the anisotropic conductive film 311 and may further improve the reliability of electrical connection. However, it is not necessary that the width W of the strip-shaped light transmissive parts 310 is equal to or less than one third. For the thicknesses of the respective films in the structures in FIGS. 10 and 11, e.g., the same thicknesses as the thicknesses shown in the table in FIG. 9 may be used, and the same processes, thicknesses, materials, etc. as those of the above description related to FIG. 9 may be appropriately used and the same advantages may be obtained. However, the thicknesses of the respective films may be appropriately determined.

Figure 12:
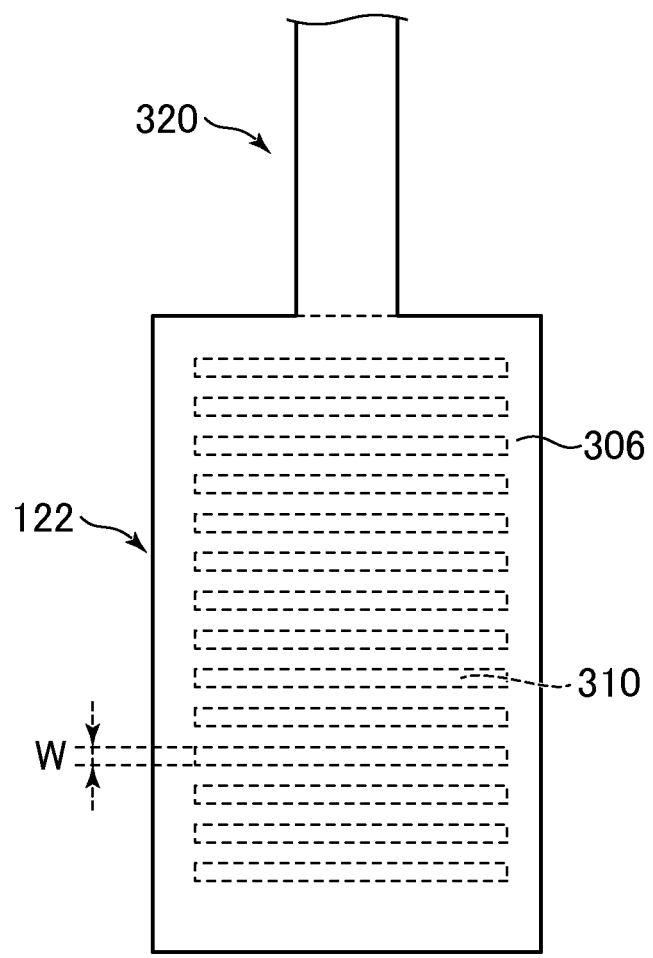
FIG. 12 is a plan view schematically showing a terminal in a third modified example.

FIG. 12 is a plan view schematically showing the substrate terminal 122 in a third modified example. In the second modified example of FIG. 10, the substrate terminal 122 has the rectangular shape having long sides and short sides in the plan view, and the plurality of strip-shaped light transmissive parts 310 extend in parallel along the long sides, however, the modified example is different in that the plurality of strip-shaped light transmissive parts 310 extend in parallel along the short sides. Even when the arrangement of the light transmissive parts 310 is formed as shown in FIG. 12, the same advantages as those of the above described first and second modified examples may be obtained.

Figure 13:
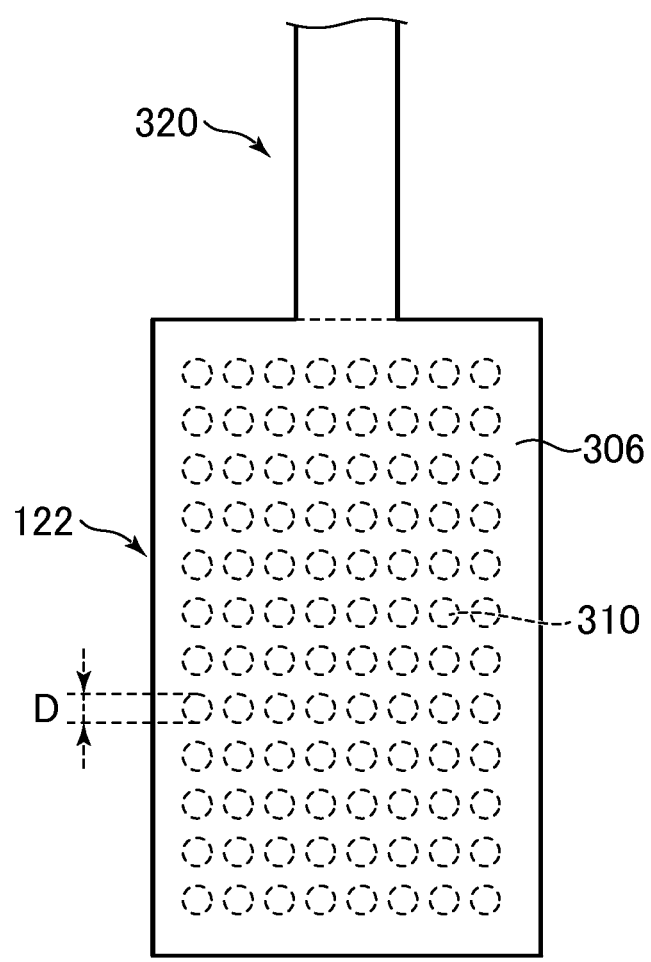
FIG. 13 is a plan view schematically showing a terminal in a fourth modified example.

FIG. 13 shows a fourth modified example of the above described embodiment. FIG. 13 is a plan view schematically showing the substrate terminal 122 in the fourth modified example. In the modified example, the light transmissive parts 310 have circular shapes and a plurality of the parts are arranged. Even when the shape and the arrangement of the light transmissive parts 310 are provided as shown in FIG. 13, the same advantages as those of the above described first and second modified examples may be obtained. Further, as described in the second modified example, the diameter D of the circular light transmissive parts 310 may be made to be a width equal to or less than one third of a particle diameter of metal particles of the anisotropic conductive film 311, and thereby, the metal particles may be prevented from entering the light transmissive films 308 at pressure-joining of the anisotropic conductive film 311 and the reliability of electrical connection may be further improved. However, it is not necessary that the diameter D of the circular light transmissive parts 310 is equal to or less than one third. Furthermore, in the fourth modified example, the plurality of circular light transmissive parts 310 may be arranged, however, the plurality of light transmissive parts 310 having rectangular shape or other shapes may be provided. Also, in the fourth modified example, the same advantages as those of the above described first to third modified examples may be obtained.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a transparent substrate;
    a plurality of pixels arranged on the transparent substrate;
    a plurality of wires that respectively supply signals to the plurality of pixels;
    terminals electrically connected to the respective plurality of wires;
    electronic components electrically connected to the terminals; and
    an anisotropic conductive film that electrically connects the terminals and the electronic components,
    wherein terminals are divided into a first region and a second region in a plan view,
    the first region has a planar shape of a first part containing the same material as that of the wires,
    the second region has a planar shape of a second part containing a material having light transmissivity, and
    the second part penetrates from a surface at the substrate side to a surface at the anisotropic conductive film side of the first part.

2. The display device according to claim 1, wherein the second part includes a plurality of layers, and
    at least one of the plurality of layers is a layer of an inorganic insulative material.

3. The display device according to claim 1, wherein the first part has a metal multilayer film having a light-blocking property.

4. The display device according to claim 1, wherein the second region has a width equal to or less than one third of a diameter of a metal particle of the anisotropic conductive film.

5. The display device according to claim 1, wherein the second region is formed in a plurality of locations of the first region in a plan view.

6. The display device according to claim 1, wherein the second region has a circular shape.

7. The display device according to claim 1, wherein a plurality of the second regions are formed in strip shapes and arranged in parallel in a plan view.

* * * * *